(12) United States Patent
Meyer

(10) Patent No.: US 9,939,932 B2
(45) Date of Patent: Apr. 10, 2018

(54) POSITION SENSING DEVICE AND METHOD USING SELF-CAPACITANCE

(71) Applicant: Advanced Sensor Technology Limited, Central, Hong Kong (CN)

(72) Inventor: Hans U. Meyer, Morges (CH)

(73) Assignee: Advanced Sensor Technology Limited, Tortola (VG)

( * ) Notice: Subject to any disclaimer, the term of this patent is extended or adjusted under 35 U.S.C. 154(b) by 224 days.

(21) Appl. No.: 14/663,680

(22) Filed: Mar. 20, 2015

(65) Prior Publication Data

US 2015/0268790 A1   Sep. 24, 2015

Related U.S. Application Data

(60) Provisional application No. 61/968,546, filed on Mar. 21, 2014.

(51) Int. Cl.
   *G01B 7/06*       (2006.01)
   *G01D 5/241*      (2006.01)
   (Continued)

(52) U.S. Cl.
   CPC ......... *G06F 3/0362* (2013.01); *G01D 5/2415* (2013.01); *H03K 17/955* (2013.01)

(58) Field of Classification Search
   CPC . G01B 7/02; G01B 7/04; G01B 7/042; G01B 7/044; G01B 7/06; G01B 7/08;
   (Continued)

(56) References Cited

U.S. PATENT DOCUMENTS

| | | | | |
|---|---|---|---|---|
| 4,543,526 A | * | 9/1985 | Burckhardt et al. . | G01D 5/2415 324/607 |
| 4,893,071 A | * | 1/1990 | Miller ................. | G01D 5/2451 324/660 |

(Continued)

FOREIGN PATENT DOCUMENTS

| | | | | |
|---|---|---|---|---|
| EP | | 2922205 A1 * | 9/2015 | ........... H03K 17/955 |

OTHER PUBLICATIONS

EPO, European Search Report for EP 2922205 dated Jul. 28, 2015, 2 pages.*

(Continued)

*Primary Examiner* — R. A. Smith
(74) *Attorney, Agent, or Firm* — Leydig Voit and Mayer

(57) ABSTRACT

A capacitive position sensing system has a pickup electrode, a shield electrode partially enclosing the pickup electrode, and an essentially grounded relatively movable target near the pickup electrodes; a capacitance-to-digital converter, and switching means for connecting each electrode in turn to the converter input or to ground. A capacitive position sensing method in the system includes measuring a first capacitance C1 of at least one pickup electrode set with the shield electrode set grounded, measuring a second capacitance C2 of at least one shield electrode set with the pickup electrode set grounded, and measuring a third capacitance C3 of the pickup electrode set and the shield electrode set connected together; and calculating a first result indicating a position of a target using the first capacitance C1, the second capacitance C2 and the third capacitance C3.

10 Claims, 4 Drawing Sheets

(51) Int. Cl.
*G06F 3/0362* (2013.01)
*H03K 17/955* (2006.01)

(58) Field of Classification Search
CPC ........ G01B 7/082; G01B 7/085; G01B 7/087; G01D 5/241; G01D 5/2412; G01D 5/2415; G01D 5/2417; G06F 3/0362; G06F 3/041; G06F 3/044; H03K 17/955; H03K 2217/960705; H03K 2217/960765
USPC .................................................... 33/706, 784
See application file for complete search history.

(56) References Cited

U.S. PATENT DOCUMENTS

| | | | | |
|---|---|---|---|---|
| 5,166,679 | A * | 11/1992 | Vranish et al. | B25J 13/086 324/687 |
| 5,214,388 | A * | 5/1993 | Vranish et al. | G01D 5/2405 324/662 |
| 5,304,937 | A | 4/1994 | Meyer | |
| 5,394,096 | A * | 2/1995 | Meyer | G01D 5/2415 324/662 |
| 5,534,859 | A * | 7/1996 | Meyer | G01D 5/2415 324/660 |
| 6,025,726 | A * | 2/2000 | Gershenfeld et al. | B60N 2/002 324/662 |
| 6,486,680 | B1 * | 11/2002 | Mull | B65H 7/04 324/658 |
| 7,997,132 | B2 * | 8/2011 | Ross, Jr. et al. | G01F 23/265 73/290 B |
| 8,193,822 | B2 * | 6/2012 | Welland | G01R 27/2605 324/658 |
| 2003/0016849 | A1 | 1/2003 | Andrade | |
| 2005/0092108 | A1 | 5/2005 | Andermo | |
| 2008/0196945 | A1 | 8/2008 | Konstas | |
| 2012/0280698 | A1 * | 11/2012 | Oya | G06F 3/03547 324/658 |
| 2013/0207677 | A1 * | 8/2013 | Togura | G01R 27/2605 324/685 |

OTHER PUBLICATIONS

EPO, European Search Opinion for EP 2922205 dated Jul. 28, 2015, 4 pages.*

* cited by examiner

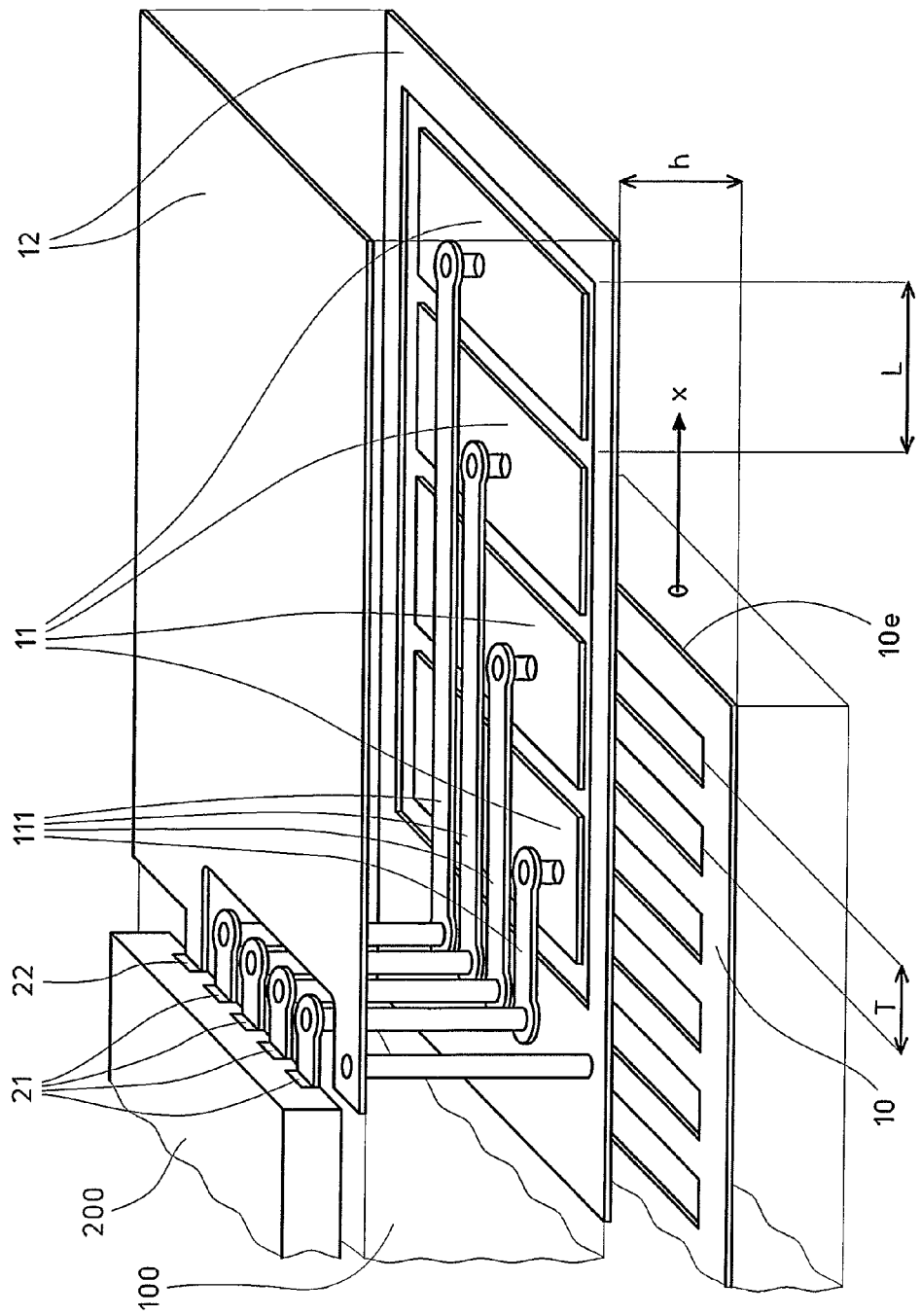

POSITION SENSING DEVICE AND METHOD USING SELF-CAPACITANCE

CROSS-REFERENCE TO RELATED APPLICATIONS

This application claims the benefit of U.S. Provisional Patent Application Ser. No. 61/968,456 filed Mar. 21, 2014, which is incorporated herein by reference.

FIELD OF THE INVENTION

The invention relates to a capacitive position sensing device and method based on the measurement of electrodes' self-capacitance.

BACKGROUND OF THE INVENTION

Existing capacitive position sensors directly measure mutual capacitance between relatively movable electrodes to avoid or at least reduce the influence of parasitic capacitance. ASICs (Application-Specific Integrated Circuits) have been the only way to implement such sensors, but only a few applications like digital calipers and levels had markets big enough to write off an ASIC's high development costs.

Recently, several mass-produced microcontrollers with integrated capacitive touch-sensing electronics have become available. These can also be used for position sensing applications other than touch detection. For example, U.S. Pat. No. 7,997,132 to Ross Jr. et al. discloses a capacitive sensor assembly for sensing position or liquid levels through one or more "antenna probes" connected to "an integrated chip normally associated with touch screen displays".

These microcontrollers sense electrodes' self-capacitance, adequate for keyboard touch detection. However, capacitance to the sensed object is only a fraction of an electrode's self-capacitance, parasitic capacitance, mainly from interconnections, making up the rest. The contribution of this parasitic capacitance, as well as of its drift with contamination such as moisture and condensation, must thus be cancelled. This is usually done by monitoring capacitance in the absence of touch and keeping the touch detection threshold just above it. For position sensing, though, other approaches are needed. An obvious one is to reduce parasitic capacitance, but there are limits: on a printed circuit board for example, most of the parasitic capacitance is through the substrate, with typically 4 to 5 times the dielectric constant of air, and varies strongly with temperature, moisture absorption and condensation.

A well-known and efficient method for removing the effects of parasitic capacitance is by surrounding an electrode with a shield driven by a unity gain buffer having its input tied to the electrode: coupling is virtually eliminated by the nulled shield-to-electrode voltage and by the shielding provided. U.S. Pat. No. 5,166,679 to Vranish et al. discloses a capacitive proximity sensing element backed by a shield driven at the same voltage. U.S. Pat. No. 5,214,388 to Vranish et al. discloses multiple sensing elements backed by a common shield, with circuitry adjusting all sensing element voltages to the shield voltage: this reduces mutual coupling between elements to a negligible level, so that all elements can be sensed simultaneously. A simpler approach is used in the "Electric Field Imaging Devices" integrated circuit family exemplified by the Motorola MC33794 and the Freescale MC33941: multiplexers switch one electrode at a time to the capacitance-sensing circuit and to a unity gain buffer driving the shield output, while the remaining electrodes are grounded. As this does not take care of mutual coupling between electrodes, the data sheets suggest using one coaxial cable per electrode and connecting all shields to the shield output. And unlike microcontrollers, these integrated circuits are not programmable.

In general, unity gain buffers and multiplexers are not integrated in microcontrollers with integrated touch sensing, so they would have to be added to the circuit. Anyway, whether integrated or added externally, unity-gain buffers driving capacitive loads with the bandwidth and slew rate required for the output voltage to follow the input voltage need a much higher supply current than a simple touch-sensing microcontroller without shield driving outputs.

Finally, a drawback of capacitive position sensors in general is the difficulty in monitoring contamination, which can in most cases only be detected when the measured capacitance, or its change, exceeds some threshold. As the sensor is very likely to become unreliable way before the threshold is reached, the warning would come too late.

SUMMARY OF THE INVENTION

It is an object of the invention to overcome shortcomings in prior art capacitive position sensing devices or methods.

Accordingly, in a first aspect of the invention there is provided a capacitive position sensing method in a measurement system having a pickup electrode set, one shield electrode set; and an essentially grounded relatively movable target near the pickup electrodes, the method comprising measuring a first capacitance $C1$ of at least one pickup electrode set with the shield electrode set grounded, measuring a second capacitance $C2$ of at least one shield electrode set with the pickup electrode set grounded, and measuring a third capacitance $C3$ of the pickup electrode set and the shield electrode set connected together; and calculating a first result indicating a position of a target using the first capacitance $C1$, the second capacitance $C2$ and the third capacitance $C3$.

Preferably, the pickup electrode set comprises a pickup electrode or a plurality of pickup electrodes connected together, and the shield electrode set comprises a shield electrode with the pickup electrodes connected to the shield electrode.

Preferably, calculating the first result comprises subtracting the second capacitance $C2$ from the first capacitance $C1$ to obtain an intermediate result and adding the intermediate result and the third capacitance $C3$ ($C1-C2+C3$).

Preferably, the method further includes calculating a second result indicating a degree of contamination comprises adding the second capacitance $C2$ to the first capacitance $C1$ to obtain an second intermediate result and subtracting the third capacitance $C3$ fro the second intermediate result ($C1+C2-C3$).

Preferably, a linear or curvilinear pickup electrode array defines a track along which a target in the shape of a screen is movable at an essentially constant gap.

Preferably, the first result is calculated for the pickup electrode set.

Preferably, the second result is calculated from the pickup electrode set.

Preferably, the method further includes using an incremental position sensing device scale as a target, thereby enabling an absolute position determination over a range larger than the incremental sensor's pitch.

In a first aspect of the invention there is provided capacitive position sensing device comprising a pickup electrode, a shield electrode partially enclosing the pickup electrode, and an essentially grounded relatively movable target near the pickup electrodes; a capacitance-to-digital converter, and switching means for connecting each electrode in turn to the converter input or to ground.

Preferably, the capacitive position sensing device further comprises a linear or curvilinear pickup electrode array defining a track along which a target in the shape of a screen is movable at an essentially constant gap.

Preferably, the capacitive position sensing device further comprises an incremental position sensing device scale, the incremental position sensing device scale defining a target thereby enabling an absolute position determination over a range larger than the incremental sensor's pitch.

Preferably, the incremental position sensing device is capacitive or inductive.

Preferably, the pickup electrode array faces an edge of the incremental position sensing device scale.

Preferably, a common printed circuit board is shared with the incremental position sensing device.

Further aspects of the invention will become apparent from the following description which is given by way of example only to illustrate the invention.

BRIEF DESCRIPTION OF THE DRAWING

FIG. 8 illustrates a preferred embodiment of the invention.

DESCRIPTION OF THE INVENTION

The position sensors described here are based on measuring an electrode's self-capacitance, in order to use microcontrollers with integrated touch-sensing electronics, but of course any suitable circuit measuring self-capacitance could be used instead. The circuit must be able to measure the self-capacitance on one or a plurality of sensing pads or pins by switching them to a capacitance-to-digital converter linear enough for the required accuracy, while switching the remaining sensing pads to ground.

By way of example, a capacitive sensing microcontroller meeting these requirements is the Silicon Labs C8051F99x, measuring the self-capacitance of a sensing pad or of any group of up to 14 sensing pads by connecting them to a successive-approximation capacitance-to-digital converter of the type disclosed in U.S. Pat. No. 8,193,822 to Welland. The converter's most sensitive range is around 60 pF and at its default resolution of 13 bit one conversion takes about 25 µs.

Figure 1:
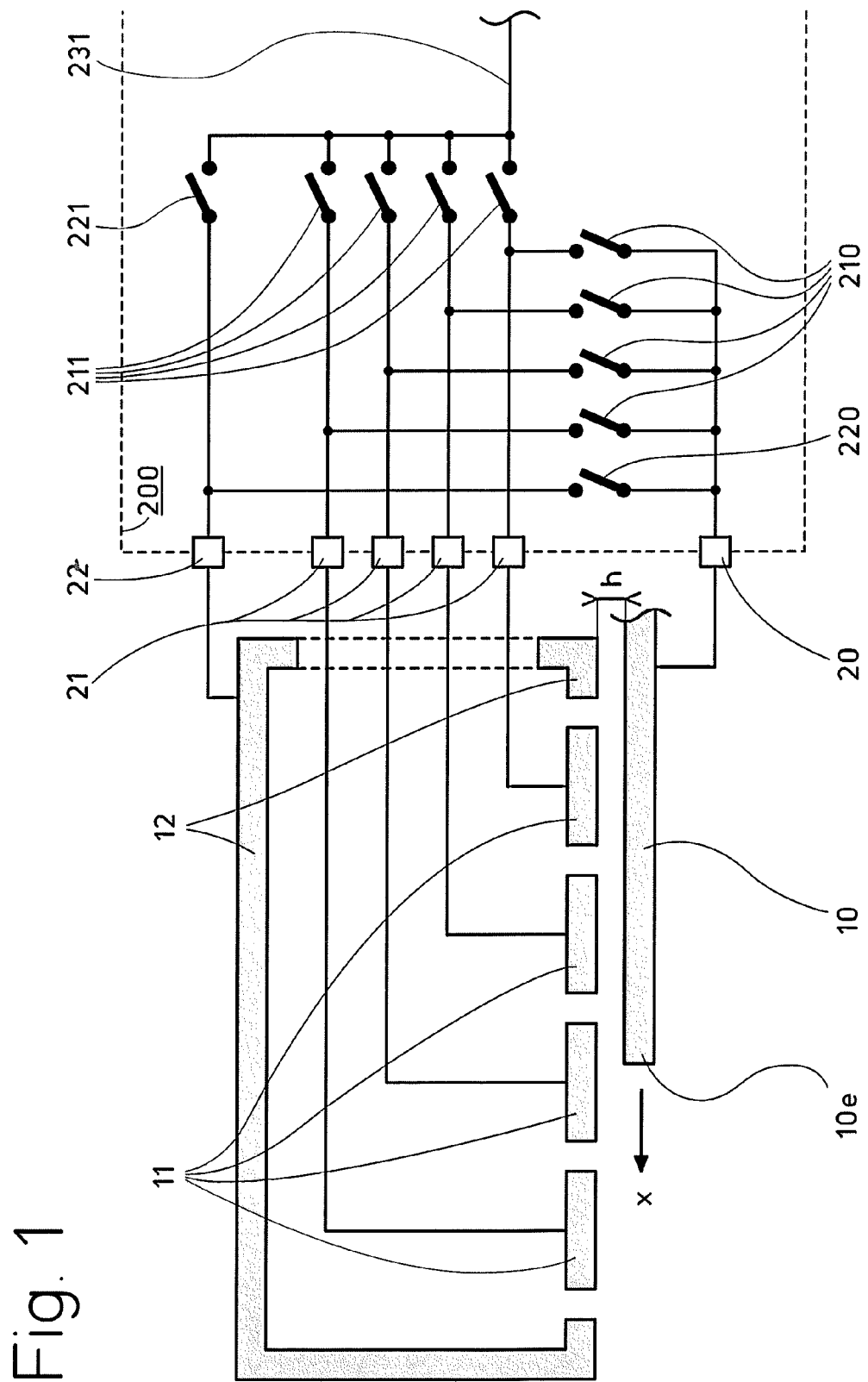
FIG. 1 illustrates a capacitive sensor and circuitry according to the invention.

FIG. 1 schematically shows a sectional view of a capacitive position sensor with an array of pickup electrodes 11 facing a grounded target 10 whose end 10e is movable at a constant gap h from the array along a measurement axis x. A shield electrode 12 surrounds the array of pickup electrodes 11 on the areas not facing the target. All electrodes are viewed edge-on. A touch-sensing microcontroller 200 is partially outlined near the shield and pickup electrodes. Normally it should be on or very near the circuit carrying the electrodes; if not, the shield electrode 12 should surround the pickup electrodes' connections all the way to microcontroller 200, for example in the form of a cable shield.

The target 10 is connected either directly as shown here, or through a sufficiently large capacitance, to a ground pad 20 of microcontroller 200. The pickup electrodes 11 and the shield electrode 12 are respectively connected to sensing pads 21 and sensing pad 22 of the microcontroller 200. Inside the microcontroller 200, sensing pad 22 is connected to switches 221 and 220 and each sensing pad 21 is connected to one of the switches 211 and to one of the switches 210. Switch 221 and switches 211 are connected to the analog input 231 of the microcontroller's capacitance-to-digital converter (not shown). Switch 220 and switches 210 are connected to ground pad 20.

Figure 2:
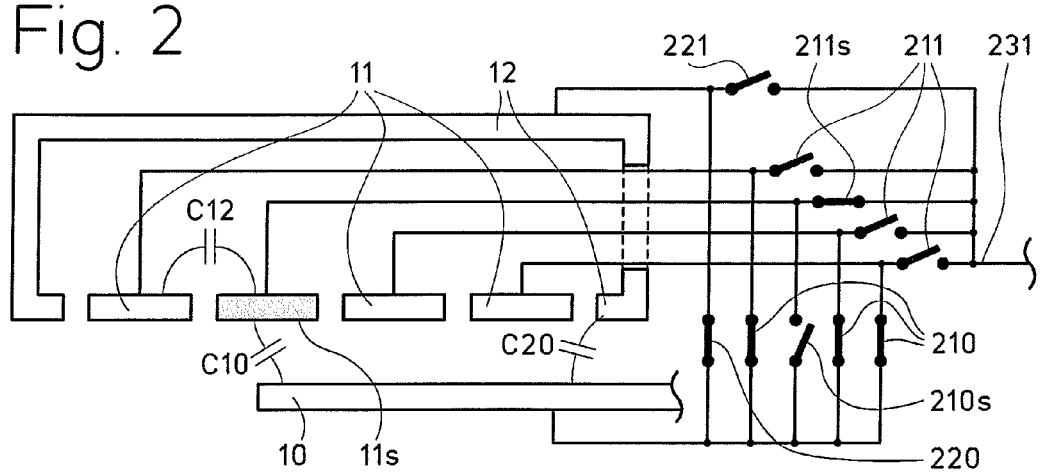
FIG. 2 shows the sensor set up for measuring self-capacitance C1.
Figure 3:
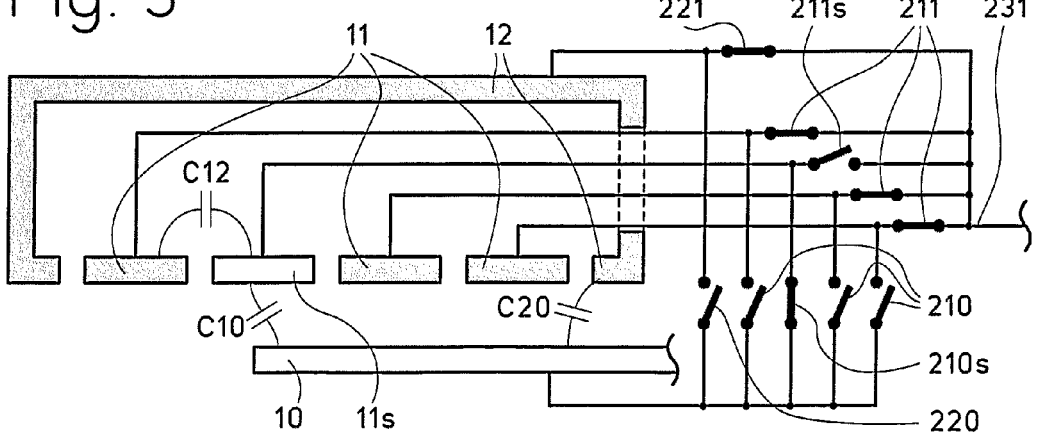
FIG. 3 shows the sensor set up for measuring self-capacitance C2.
Figure 4:
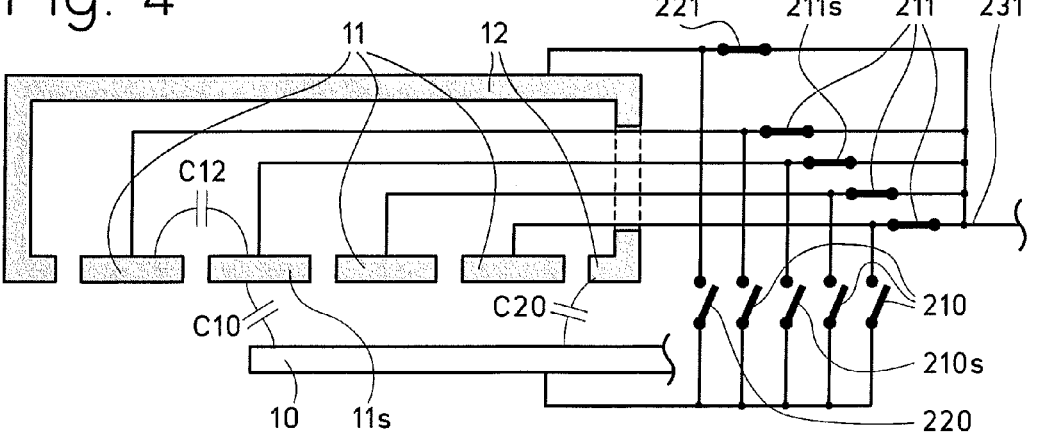
FIG. 4 shows the sensor set up for measuring self-capacitance C3.

Pickup electrodes 11 may be selected to form a pickup electrode set, for measuring and calculating the set's mutual capacitance to the target 10. In FIGS. 2, 3, 4 illustrating the capacitance measuring method only one pickup electrode 11 is selected, renamed electrode 11s, as it forms now the pickup electrode set. However, a pickup electrode set might as well be formed by any combination and number of pickup electrodes (each renamed 11s). The shield electrode 12 with any remaining pickup electrodes 11 connected to it forms a shield electrode set.

The capacitance-to-digital converter measures the self-capacitance on its input 231, makes the three different measurements, shown in FIGS. 2, 3, 4 with the selected pickup electrode set (here, electrode 11s), in order to calculate the mutual capacitance as a result. During each measurement, all pickup electrodes 11s of a pickup electrode set are connected together (here, only one electrode), forming one combined electrode, and all electrodes 11 and 12 of a shield electrode set are also connected together, forming another combined electrode. Including target 10, they form three electrodes having the three following mutual capacitances: capacitance C10 between pickup electrode set and target, capacitance C20 between shield electrode set and target and capacitance C12 between pickup and shield electrode sets. For clarity, the microcontroller's outline and pads have been left out of FIGS. 2, 3, 4.

The switches 211 and 210 connected to the pickup electrodes 11s of the selected pickup electrode set are similarly renamed 211s and 210s. As the pickup electrode set consists here of only one electrode, there is consequently only one switch 211s and one switch 210s. As a remark, the following description would as well apply to a multi-electrode set by replacing in the text "switch 211s (or 210s)" by "switches 211s (or 210s)".

For a given pickup electrode set, three self-capacitances C1, C2, C3, put on the capacitance-to-digital converter's input 231 with the three switch settings shown in FIGS. 2, 3, 4 respectively, are measured one at a time. The sequence is unimportant, as long as all three self-capacitances are measured within a time frame short enough for them to remain essentially unchanged, so that accurate results can be calculated from them.

FIG. 2 shows the switch setting for measuring self-capacitance C1. The pickup electrode set (shaded) is connected to the converter's input 231 by closed switch 211s (switches 211 and 221 are open). The shield electrode set is connected to ground by closed switches 210 and 220 (switch 210s is open), so there is no voltage on capacitance C20, hence no displacement current through it. The self-capacitance C1 at the converter's input 231 is thus the self-capacitance of the pickup electrode set, equal to the sum of its mutual capacitance C10 with the target 10 and of its mutual capacitance C12 with the shield electrode set:

$$C1=C10+C12$$

FIG. 3 shows the switch setting for measuring self-capacitance C2. The shield electrode set (shaded) is connected to the converter's input 231 by closed switches 211 and 221 (switch 211s is open). The pickup electrode set is connected to ground by closed switch 210s (switches 210 and 220 are open), so there is no voltage on capacitance C10, hence no displacement current through it. The self-capacitance C2 at the converter's input 231 is thus the self-capacitance of the shield electrode set, equal to the sum of its mutual capacitance C20 with the target 10 and of its mutual capacitance C12 with the pickup electrode set:

$$C2=C20+C12$$

FIG. 4 shows the switch setting for measuring self-capacitance C3: all pickup and shield electrodes (shaded) are connected to the converter's input 231 by closed switches 211, 211s and 221 (switches 210, 210s and 220 are open), so there is no voltage on capacitance C12, hence no displacement current through it. The self-capacitance C3 at the converter's input 231 is thus the self-capacitance of all pickup electrodes plus shield electrode or of both electrode sets connected together. It is equal to the sum of the pickup electrode and shield electrode sets' mutual capacitances C10 and C20 with the target 10:

$$C3=C10+C20$$

Calculating (C1−C2+C3)/2 yields mutual capacitance C10 with the target as a result, as all other mutual capacitances cancel out. It is not affected by the shield electrode's parasitic capacitance to external conductors (not shown), as it can be considered part of mutual capacitance C20 between shield 12 and target 10, and thus cancels out as well. It removes the effects of parasitic capacitance just as a unity gain buffer fed by the pickup electrode set and driving the other electrodes would, but with simpler circuitry and lower power consumption.

However, the result is affected by the pickup electrodes' parasitic capacitances to ground via other paths than the target, as these may also be considered part of the mutual capacitance C10 between pickup electrode set and target, as it is nearly impossible to distinguish this parasitic capacitance to ground from the mutual capacitance to a target being essentially grounded.

This parasitic capacitance to ground bypassing the scale can easily be reduced by proper layout, except for the unavoidable internal capacitances of the microcontroller's sensing pads or pins. Fortunately these pads' capacitances are small and their change with temperature or humidity is insignificant, making it easy to compensate for them, for example by initially carrying out the measurements of self-capacitances C1, C2, C3 in the absence of a target, calculating result (C1−C2+C3)/2, and storing it as a constant in memory for correcting later results.

Measuring three self-capacitances rather than only one mutual capacitance additionally makes early detection of contamination possible. Typically condensation, which forms a film or droplets increasing the mutual capacitance C12 between pickup and shield electrode sets. Capacitance C12 can be calculated as (C1+C2−C3)/2. As capacitance C12 is only marginally influenced by the target's position, any capacitance change is most likely due to contamination and may thus be detected before position sensing is compromised. In comparison, it is difficult to tell contamination from position change by a single mutual capacitance measurement (C10), unless contamination is so bad that the capacitance C10 exceeds a plausible value.

In a sensor having an array of pickup electrodes 11 as shown in FIG. 1, determining the position of the target 10 usually requires finding most if not all pickup electrodes' mutual capacitances C10 with the target 10, so the measurements must be repeated for many single- or multi-electrode pickup electrode sets. Position updates from these pickup electrodes sets should be quick enough to minimize distortions from speedy motion. This can be achieved by first calculating only capacitances C12 from the measured capacitances C1, C2, C3 and later calculating capacitances C10 by measuring capacitances C1 again and subtracting stored capacitances C12, as capacitance C12 varies much less with position and time than capacitance C10: in most cases moisture or condensation changes significantly only after a large number of measurements. It thus makes sense to measure and calculate capacitances C12 first, store them and subtract them from the single pickup electrode sets' capacitances C1, measured with the shield electrode sets to ground: the result after calculation yields capacitances C10, as C1 is equal to C10+C12. Fewer measurements are needed, as only the less frequent updates of capacitance C12 need the measurements of all capacitances C1, C2, C3 while the more frequent updates of capacitance C10, indicative of position, only need repeating the measurement of capacitances C1. Position updates can thus be done at a quicker rate, either to reduce the tracking error due to speedy motion, or simply for saving power. Even so, capacitances C10 are still a function of the measured capacitances C1, C2, C3, although through the intermediary of capacitance C12.

Embodiments of the invention include linear or curvilinear pickup electrode arrays similar to the one shown in FIG. 1 defining a track or axis x along which a target 10 in the shape of a screen is movable with a constant gap h, the pickup electrode array being surrounded by a shield electrode 12 on the areas not facing the target. The mutual capacitance measurement derived from the three self-capacitance measurements is calculated for each pickup electrode 11, yielding N results for N electrodes for determining an approximate position. The embodiments may have different uses according to their target's or screen's configuration, as shown by the examples in FIGS. 5, 6, 7, graphically showing the array of pickup electrodes, each of length L along axis x, with each electrode 11, symbolically displaying a superimposed bar of same length L along axis x and of height proportional to the electrode's mutual capacitance Cm with the target 10. It is assumed that in the absence of a target, mutual capacitance Cm and thus the bar's height is zero, with the parasitic capacitance to ground mentioned earlier being compensated.

Figure 5:
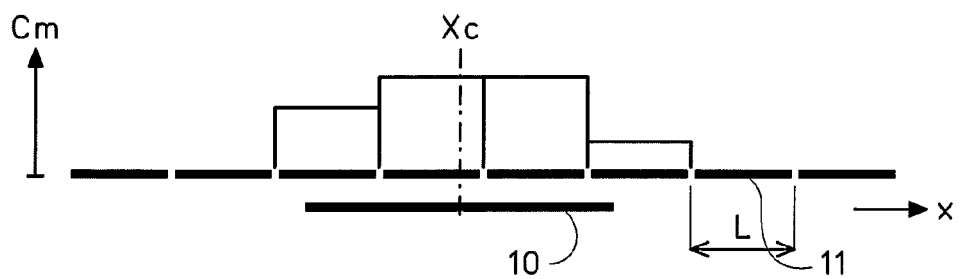
FIG. 5 is a graphical representation of each electrode's mutual capacitance with the target in an embodiment of the invention using a target shorter than the array of pickup electrodes.

In FIG. 5, the target or screen 10 is shorter than the array. Electrodes squarely facing the screen have a maximal mutual capacitance, those not facing it zero, and those over its edges an intermediate value fairly proportional to the degree of overlap. This being the case, the electrode's center position Xc is approximately the one dividing the superimposed bars' surfaces left and right of it in equal areas.

Figure 6:
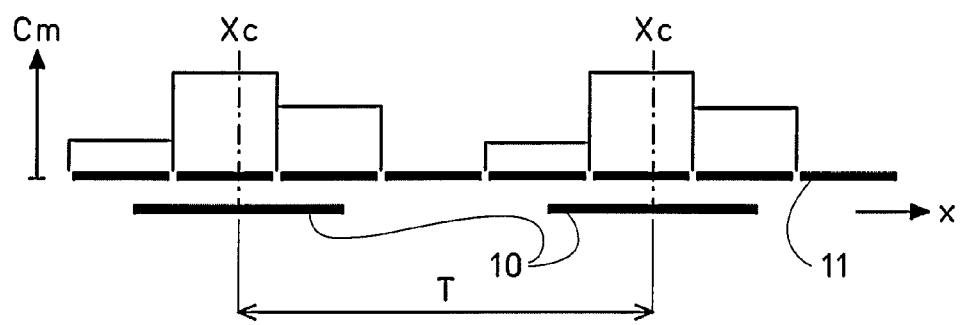
FIG. 6 is a graphical representation of each electrode's mutual capacitance with the target in an embodiment of the invention using a spatially periodic target.

In FIG. 6, the target or screen 10 has a spatially periodic configuration, consisting of a series of rectangular screens (seen edge-on) of spatial period or pitch T equal here to the lengths L of 4 electrodes along axis x, i.e. 4 L. The screens' center positions Xc are determined in the same manner for a single short screen, but within a pitch T, for example by choosing only the pickup electrodes facing one screen and finding the position dividing the superimposed bars' surfaces left and right in equal parts. A more accurate result is given by averaging the individually computed positions Xc for each pitch T. A quicker way to measure would be connecting all pickup electrodes 11 having a center-to-center distance equal to a pitch T together, that is, every fourth electrode in FIG. 6, thus forming only four pickup electrode sets. Or a fractional pitch by electrode length (T/L) ratio, for example 3.333, could be selected, resulting here in three offset electrode-to-screen configurations, from which a smoother, more linear position characteristic may be calculated. Such spatially periodic target or screen configurations would be an attractive solution for digital capacitive calipers, whose slider carrying the pickup electrodes is much shorter than the scale Spatially periodic screen series may have missing screens at irregular intervals, enabling absolute position detection over a range much longer than the pickup electrode array, while essentially keeping the accuracy obtained by averaging the positions of multiple screens facing the array. Accurate measurement within a pitch T could be done with pickup electrode sets as just described, while missing screens would be detected by sets formed by all contiguous electrodes within a pitch and then using logic to find the absolute position from the missing screens' positions. An absolute digital caliper might be implemented this way.

Figure 7:
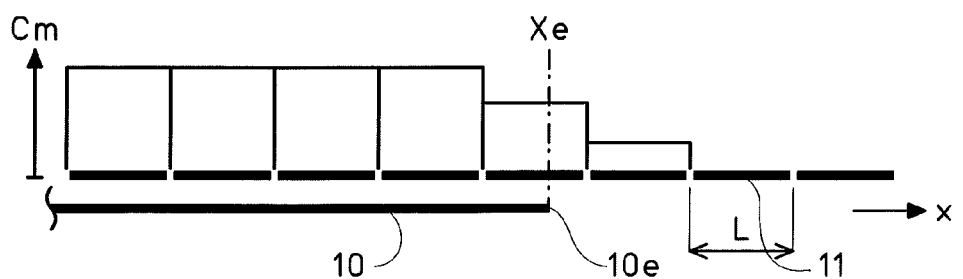
FIG. 7 is a graphical representation of each electrode's mutual capacitance with the target in an embodiment of the invention using a target longer than the array of pickup electrodes.

In FIG. 7, the target or screen 10 is longer than the array, and the position Xe of its edge 10e relative to the electrode facing it is in a linear relationship with their mutual capacitance. For example, if the scaled result is 0.7, on a scale set to 1 for electrodes to the left, facing the electrode, and 0 for those to the right, not facing it, position Xe is approximately equal to the number of electrodes to the left plus 0.7 times an electrode's length.

In reality, though, the capacitances of electrodes 11 not facing the target 10 would have some residual mutual capacitance, mostly from the microcontroller's sensing pad input capacitance. As mentioned, this is easy to compensate. The capacitance of electrodes 11 facing the target 10 is more problematic, as it strongly depends on the gap between array and target. It may vary from electrode to electrode and also, for a given electrode, with the target's position. A simple way to conserve accuracy is to find the mutual capacitance of the electrode facing the end of the target, find the mutual capacitance of its neighbor not facing the scale and reference it as a zero, find the mutual capacitance of its other neighbor facing the scale and reference it as a one, and finally scale the middle electrode's capacitance using these two references: the interpolation value, being determined with the help of nearby references, will be less sensitive to long range gap variations. These position measurements do not need capacitance measurements with a precise scale factor, as long as it is the same for all electrodes. This is obviously the case, as all capacitances are digitized in the same converter.

Besides providing the position along axis x, a position sensor measuring self-capacitance may also be used to calculate the gap, which is roughly inversely proportional to the calculated mutual capacitance of a pickup electrodes facing the target. By comparing mutual capacitances of many electrodes it is also possible to find the gap's variation along the axis, i.e. the pitch angle. Roll and yaw could also be found, for example by providing two rows of side by side pickup electrodes instead of one. These data may contribute to a more accurate determination of the position x, for example by detecting guidance errors between scale and pickup electrode array which may then be compensated.

A preferred embodiment of the invention is a coarse absolute position sensor sharing a printed circuit with an incremental position sensor and using the latter's scale as its target. The incremental position sensor is highly accurate within its spatial period or pitch T while the coarse absolute sensor determines the number of pitches. Accordingly, it only needs to be accurate to less than plus or minus one half pitch to avoid errors: for a typical incremental sensor pitch T of 1 mm, the coarse sensor would have to be accurate to ±0.5 mm. Better accuracy is easy to attain, though, leaving some margin for error sources arising from contamination or fast position change. The microcontroller computes the exact absolute position by combining the coarse absolute position calculated from its capacitance measurements with the accurate position received from the incremental sensor.

Such an absolute measuring system can be very compact, making it suitable for applications such as digital linear gauges or digital indicators. These have a fixed incremental sensing area and a movable scale attached by one end to a cylindrical probe guided along the measurement axis x. The scale's minimal length is the sum of the fixed sensing area's extension along axis x and the probe's total travel, the scale having to face the whole sensing area in any position. This means that if the probe is fully extended (all the way out) the scale still faces the sensing area, with its tip barely sticking out from the end opposed to the probe. As the probe moves to its fully retracted position, the scale tip at the opposite end moves until it sticks out from the sensing area by an additional total probe travel, so space has to be left for accommodating the scale and can thus be used to lodge the coarse absolute sensor. A small and cost-effective solution for this purpose is a capacitive sensor using a touch-sense microcontroller.

FIG. 8 illustrates the coarse absolute sensor part of the common printed circuit with the end of the shared scale or target. Dimensions perpendicular to the plane of the scale (thickness of printed circuit and scale, gap between both) are exaggerated for better viewing. The gap h is actually much smaller, in order to get sufficient capacitance variation with position.

The printed circuit 100, shown in transparence, has a linear array of pickup electrodes 11 on its bottom side facing scale 10. The array covers the total travel of scale tip 10e and is surrounded by shield electrode 12, around electrodes 10 and above them, on the printed circuit's top surface, i.e. the one facing away from the scale. Shield electrode 12 is connected to sensing pad 22 of microcontroller 200, and each electrode 11 is connected by a printed circuit trace 111 to a sensing pad 21 of microcontroller 200. For most of their length, these traces 111 are located on a buried metal level, so they are shielded from the exterior either by shield electrode 12 or by pickup electrodes 11. If some uniform capacitance to ground can be tolerated, traces 111 may lie on the top surface, but should then be narrow, of equal length, and surrounded by the shield electrode, and conductors external to the printed circuit should then be sufficiently far away to keep this capacitance low.

The sensing arrangement is basically the same as shown in FIG. 7 and description. If the travel is kept short enough to have at least one electrode at one end always facing the scale and one electrode at the other end never facing the scale, measurement is straightforward: first identifying which pickup electrode faces the scale tip 10e by looking for an intermediate result, then comparing it to the results of its neighbors, that is, scaling these three results so that the neighbor with the higher result scales to 1 and the one with the lower result scales to 0; the fraction found for the intermediate result reflecting the degree of coverage of this electrode by the scale. Adding this result to this electrode's position yields the coarse absolute position, expressed in electrode lengths L. Note that the result may jump from 0 to 1 from an electrode (N) to the next electrode (N+1) if the scale tip 10e is just across the space between the two electrodes: in this case, either one electrode may then be selected, as both choices yield the same coarse absolute position, expressed in electrode lengths L: (N)+1 equals (N+1)+0. Finding the pickup electrode facing the scale tip can for instance be done by looking for the biggest transition in results between contiguous electrodes, then looking for the transitions one electrode left and right from it: the pickup electrode facing the scale tip is between where the biggest transition takes place and where the larger transition, to the left or to the right, takes place.

The embodiment only adds a microcontroller with integrated capacitive touch-sensing circuitry as well as pickup and shield electrodes to the common printed circuit board. And in most applications the microcontroller would probably just replace an already existing one, needed anyway for functions such as data output. The additional cost of converting an incremental measuring system to an absolute one is thus minimal, and with careful design it can be added without increasing the gauge's size.

The simplest and cheapest solution might be to use additional touch sensing electrodes from the same microcontroller for implementing the incremental sensor. However, the resolution and accuracy of the incremental part might not be significantly higher than the one from the coarse sensor. A sensor as described above in connection with FIG. 6, having a target formed by a periodic array of screens with a few screens left out at irregular intervals, might then be a better solution.

Improved performance can be obtained by using existing capacitive or inductive incremental position sensor ASICs, as both can sense conducting scales or targets. They are optimized for micro-power consumption and track their position continuously when switched on: the absolute sensor is thus only needed after power-on and intermittent checking, thus lowering the microcontroller's duty cycle and power consumption.

Advantageously, an inductive incremental position sensor ASIC will not interact with the coarse absolute capacitive sensor, as it is only marginally sensitive to dielectrics present in its coil's distributed capacitance. In this respect, the capacitive coarse position sensor's ability to detect condensation at an early stage might be welcome, as it can trigger an alert well before the inductive sensor's accuracy gets significantly impaired, and in any case before the rest of the electronics might start to malfunction.

Various further embodiments of the invention are defined below.

A capacitive position sensing device and method based on the measurement of electrodes' self-capacitance, including pickup electrodes, a shield electrode partially enclosing the pickup electrodes, and an essentially grounded relatively movable target near the pickup electrodes; forming at least one pickup electrode set consisting of one pickup electrode or of a plurality of pickup electrodes connected together and at least one shield electrode set consisting of the shield electrode with remaining pickup electrodes connected to it; measuring the at least one pickup electrode set's self-capacitance $C_1$ with the shield electrode set grounded, measuring the at least one shield electrode set's self-capacitance $C_2$ with the pickup electrode set grounded, and measuring the self-capacitance $C_3$ of the pickup electrode set and the shield electrode set connected together; whereby the target's position can be calculated from the at least one self-capacitance $C_1$, the at least one self-capacitance $C_2$ and self-capacitance $C_3$.

The mutual capacitance between pickup electrode set and target may then be calculated from the result $(C_1-C_2+C_3)/2$, indicative of the position to be detected. The result equals the mutual capacitance between pickup electrode set and target, as all other mutual capacitances cancel out. It removes the effects of parasitic capacitance just as a unity gain buffer fed by the pickup electrode set and driving the other electrodes would, but with simpler circuitry and lower power consumption.

The shield electrode's parasitic capacitance to ground, that is, the capacitance to ground bypassing the scale, also cancels out, but a pickup electrode's parasitic capacitance to ground, that is, bypassing target, shield, or another pickup electrode, does not. A proper layout, however, can reduce this parasitic capacitance practically all the way down to the electrode's microcontroller pad capacitance, which does not change much with temperature or humidity and so adds a constant capacitance to the result. It is thus easy to cancel, for example by initially measuring and calculating each pickup electrode set's capacitance in the absence of a target and storing it as a constant for later compensation.

Measuring three capacitances, rather than one only, also enables the early detection of contamination, such as condensation, increasing the mutual capacitance between adjacent electrodes. This mutual capacitance is equal to $(C_1+C_2-C_3)/2$, and is only weakly influenced by position, so that any change in this result comes mainly from contamination, enabling its detection before position sensing gets compromised. In comparison, detecting contamination by measuring only the mutual capacitance indicative of position is only possible once it exceeds a plausible value, i.e. too late.

Position detection normally requiring more than the one result from the one pickup electrode set and shield electrode set, it has to be repeated with different pickup and shield electrode sets until there are enough calculated mutual capacitances. Position measurements should proceed a rate sufficient to keep distortion due to speedy motion small. This can be done by measuring capacitances $C_1$, $C_2$, $C_3$ and calculating capacitance $(C_1+C_2-C_3)/2$, indicative of contamination, only intermittently: this result, varying little with position and time, can then be repeatedly subtracted from subsequent single measurements of capacitance $C_1$ to find the mutual capacitance $(C_1-C_2+C_3)/2$ indicative of position.

An embodiment of the invention is a linear or curvilinear pickup electrode array defining a track along which a target in the shape of a screen is movable at an approximately constant gap, with the pickup electrode array surrounded by a shield electrode on the sides not facing the target. The mutual capacitance result is found for each pickup electrode (here, each pickup electrode set consists of one electrode only), yielding N results for N electrodes. It is then straightforward to find the relative position. It is then also possible to find the gap between pickup array and target and even its variation along the track, or pitch angle, if at least two electrodes are totally covered by the screen. Gap and/or pitch data may contribute to a more accurate determination of the position x, for example by detecting guidance errors between scale and pickup electrode array, which can then be compensated.

Many target configurations may be used with such an array. The electrode may be a single screen for a compact device, or a spatially periodic series of screens to get more accuracy for incremental measurements, or a spatially periodic series of screens with a few missing, whose locations can be identified to make the measurement absolute over ranges larger than the array, while keeping the enhanced accuracy. Such target configurations could for example be used in a low cost capacitive digital caliper.

A preferred embodiment of the invention is a coarse absolute position sensor using a microcontroller including capacitive sensing and sharing a printed circuit with an incremental position sensor, the coarse sensor using the incremental sensor's scale as its target. The incremental position sensor provides the resolution and accuracy of a combined measurement while the coarse absolute sensor, which only needs to be accurate to plus or minus half the incremental sensor's pitch to avoid a position error, provides its range. The combined measurement is computed in the coarse absolute position sensor's microcontroller. This embodiment is useful for making measuring instruments such as digital linear gauges or digital indicators absolute.

Preferably, the coarse absolute sensor includes a linear array of pickup electrodes covering all positions the tip of the movable position sensor's scale can take over its range. The absolute sensor can then be located next to the incremental sensor along the measuring path, where the space is already available to accommodate the scale. In a digital linear gauge, for instance, the embodiment can be added without increasing the gauge's size.

The embodiment only adds a microcontroller with integrated capacitive touch-sensing circuitry as well as pickup and shield electrodes to the common printed circuit board. And in most applications the microcontroller would just replace an existing one, already needed for functions like digital input/output. The embodiment's low additional cost makes a simple and economical absolute measuring system possible.

Much better performance can be obtained by using existing incremental position sensor ASICs, especially if these are capacitive or inductive and thus only need conductors in the shape of electrodes or coils as sensing elements. Such ASICs, optimized for micro-power consumption, can track the position continuously when switched on, so that the absolute sensor is only needed at start-up or intermittently, thus lowering the microcontroller's duty cycle and power consumption.

Advantageously, an inductive incremental position sensor ASIC should not interact with the coarse absolute capacitive sensor. However, its accuracy might be slightly impaired by dielectrics present in its coils, in other words a water film or droplets on the surface of a flat coil. In this respect, the capacitive coarse sensor's sensitivity to condensation at an early stage might be welcome, as it can trigger an alert before the inductive sensor's accuracy gets out of spec, and in any case before the rest of the electronics might start to malfunction.

A capacitive position sensing method based on the measurement of electrodes' self-capacitance, including pickup electrodes, a shield electrode partially enclosing the pickup electrodes, and an essentially grounded relatively movable target near the pickup electrodes; forming at least one pickup electrode set consisting of one pickup electrode or of a plurality of pickup electrodes connected together and at least one shield electrode set consisting of the shield electrode with the remaining pickup electrodes connected to it; measuring the at least one pickup electrode set's self-capacitance C1 with the shield electrode set grounded, measuring the at least one shield electrode set's self-capacitance C2 with the pickup electrode set grounded, and measuring the self-capacitance C3 of the pickup electrode set and the shield electrode set connected together; whereby the target's position can be calculated from the at least one self-capacitance C1, the at least one self-capacitance C2 and self-capacitance C3.

A capacitive position sensing method wherein a result (C1−C2+C3), indicative of the target's position, is calculated for the at least one pickup electrode set.

A capacitive position sensing method wherein a result (C1+C2−C3), indicative of the degree of contamination, is calculated from the at least one pickup electrode set.

A capacitive position sensing method wherein a linear or curvilinear pickup electrode array defines a track along which a target in the shape of a screen is movable at an essentially constant gap.

A capacitive position sensing device including pickup electrodes, a shield electrode partially enclosing the pickup electrodes, and an essentially grounded relatively movable target near the pickup electrodes; further including a capacitance-to-digital converter, and switching means for connecting each electrode to the converter's input or to ground; selecting at least one pickup electrode set consisting of one or of a plurality of pickup electrodes; digitizing a self-capacitance C1 by connecting said pickup electrode set to the converter's input and the remaining pickup electrodes and the shield electrode to ground; digitizing a self-capacitance C2 by connecting said remaining electrodes and the shield electrode to the converter's input and said pickup electrode set to ground; digitizing a self-capacitance C3 by connecting the pickup electrodes and the shield electrode to the converter's input, whereby the target's position can be calculated from the at least one pickup electrode set's self-capacitance C1, the at least one self-capacitance C2, and self-capacitance C3.

A capacitive position sensing device wherein a result (C1−C2+C3), indicative of the target's position, is calculated for the at least one pickup electrode set.

A capacitive position sensing device wherein a result (C1+C2−C3), indicative of the degree of contamination, is calculated from the at least one pickup electrode set.

A capacitive position sensing device wherein a linear or curvilinear pickup electrode array defines a track along which a target in the shape of a screen is movable at an essentially constant gap.

A capacitive position sensing device using an incremental position sensing device's scale as a target, thereby enabling an absolute position determination over a range larger than the incremental sensor's pitch.

A capacitive position sensing device wherein the incremental position sensing device is capacitive or inductive.

A capacitive position sensing device wherein the pickup electrode array faces the incremental position sensing device's scale's edge.

A capacitive position sensing device wherein a common printed circuit board is shared with the incremental position sensing device.

The invention claimed is:

1. A capacitive position sensing method for a measurement system having a plurality of pickup electrodes arranged along a line, a shield electrode, and an electrically grounded target that is located proximate the pickup electrodes and is movable relative to the plurality of pickup electrodes, along the line, the method comprising:
   measuring a first capacitance, C1, of at least one and fewer than all of the pickup electrodes, with the shield electrodes and all other pickup electrodes electrically grounded,
   measuring a second capacitance, C2, of the shield electrode and some, but not all, of the pickup electrodes, with at least one of the pickup electrodes electrically grounded, and
   measuring a third capacitance, C3, of all of the pickup electrodes and the shield electrode, with all of the pickup electrodes and the shield electrode connected together; and
   calculating a first result indicating position of the target, relative to the plurality of pickup electrodes, using the first capacitance, C1, the second capacitance, C2, and the third capacitance, C3.

2. The capacitive position sensing method of claim 1, wherein calculating the first result comprises:
   subtracting the second capacitance, C2, from the first capacitance, C1, to obtain an intermediate result, and
   adding the intermediate result and the third capacitance, C3.

3. The capacitive position sensing method of claim 1 further including calculating a second result, indicating degree of contamination, comprising:
   adding the second capacitance, C2, to the first capacitance, C1, to obtain an second intermediate result, and
   subtracting the third capacitance, C3, from the second intermediate result.

4. The capacitive position sensing method of claim 1, wherein the pickup electrodes are arranged in a linear or curvilinear pickup electrode array defining a track, and including moving the target along the track at a constant gap from the pickup electrodes.

5. The capacitive position sensing method of claim 1, wherein the target has a periodic pattern with a pitch along the line, enabling absolute position determination of the target over a range larger than the pitch of the periodic pattern of the target.

6. A capacitive position sensing system comprising:
   a plurality of pickup electrodes arranged along a line;
   a shield electrode partially enclosing the pickup electrodes;
   an electrically grounded target that is located proximate the pickup electrodes and is movable relative to the plurality of pickup electrodes, along the line;
   a digital converter having an input terminal, and
   switching means for electrically connecting, in turn, respective combinations of the pickup electrodes and the shield electrode to the input terminal of the digital converter input and/or to ground for measuring a plurality of capacitances and calculating, from the plurality of capacitances measured, position of the target relative to the plurality of pickup electrodes, wherein the target has a periodic pattern with a pitch along the line, enabling absolute position determination of the target over a range larger than the pitch of the periodic pattern of the target.

7. The capacitive position sensing system of claim 6, wherein the pickup electrodes are arranged in a linear or curvilinear pickup electrode array defining a track along which the target is movable at a constant gap from the pickup electrodes.

8. The capacitive position sensing system of claim 7, wherein the pickup electrode array faces an edge of the target.

9. The capacitive position sensing system of claim 6, wherein the incremental position sensing device is capacitive or inductive.

10. The capacitive position sensing system of claim 6, including a printed circuit board, wherein the target and the pickup electrodes are disposed on opposite sides of the printed circuit board.

* * * * *